US007368852B2

(12) United States Patent
Frey et al.

(10) Patent No.: US 7,368,852 B2
(45) Date of Patent: May 6, 2008

(54) ELECTRICALLY CONDUCTIVE MATCHING LAYERS AND METHODS

(75) Inventors: Gregg W. Frey, Woodinville, WA (US); Todor Sheljaskow, Issaquah, WA (US); Walt T. Wilser, Cupertino, CA (US); Worth B. Walters, Cupertino, CA (US); Nelson H. Oliver, Sunnyvale, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 81 days.

(21) Appl. No.: 10/646,130

(22) Filed: Aug. 22, 2003

(65) Prior Publication Data

US 2005/0042424 A1 Feb. 24, 2005

(51) Int. Cl.
*H01L 41/00* (2006.01)
*H04R 17/00* (2006.01)

(52) U.S. Cl. ........................ 310/322; 310/334; 381/354

(58) Field of Classification Search .................. 428/37, 428/75, 120, 192, 201, 208, 209; 29/594; 381/428, 427, 354, 177, 174, 128, 191; 310/322; 73/832; 387/152
See application file for complete search history.

(56) References Cited

U.S. PATENT DOCUMENTS 3,171,106 A * 2/1965 Lemmond .................. 346/74.3
4,616,152 A * 10/1986 Saito et al. ................. 310/334
5,267,221 A * 11/1993 Miller et al. ................ 367/140
5,410,208 A 4/1995 Walters et al.
5,418,759 A 5/1995 Fiebiger et al.
5,488,957 A 2/1996 Frey et al.
5,545,942 A 8/1996 Jaster et al.
5,577,507 A 11/1996 Snyder et al.
5,598,051 A 1/1997 Frey
5,644,085 A 7/1997 Lorraine et al. .............. 73/641
5,648,942 A 7/1997 Kunkel, III
5,701,901 A 12/1997 Lum et al. .................. 600/463
5,711,058 A 1/1998 Frey
5,834,687 A 11/1998 Talbot et al.
6,093,150 A 7/2000 Chandler et al.
6,100,626 A 8/2000 Frey et al.
6,128,341 A 10/2000 Kwak (Continued)

FOREIGN PATENT DOCUMENTS

DE 102 01 813 A1 7/2003

(Continued)

OTHER PUBLICATIONS

WO 00/79546, Dec. 2000.*

*Primary Examiner*—Donald Loney

(57) ABSTRACT

Matching layers are provided, including: electrically conductive acoustic matching layers, methods for conducting electric current through matching layers, methods for manufacturing multi-dimensional arrays using conductive matching layers, and multi-dimensional arrays with electrically conducting matching layers. Matching layers with conductors aligned for providing electrical conduction through the thickness or range dimension of the matching layer are provided. For example, vias, aligned magnetic particles, or conductive films at least partially or entirely within the matching layer of each element allow electrical conduction from the transducer material to a ground foil or flex circuit. By using multiple electrical conductive matching layers, a gradation in acoustic impedance for better matching is provided while allowing dicing of the entire stack, including the matching layers and the electroceramic material, in one step.

15 Claims, 3 Drawing Sheets

U.S. PATENT DOCUMENTS

| | | | | |
|---|---|---|---|---|
| 6,266,857 | B1 * | 7/2001 | Corbett et al. | 29/25.35 |
| 6,429,574 | B1 | 8/2002 | Mohr, III et al. | |
| 6,437,487 | B1 | 8/2002 | Mohr, III et al. | |
| 6,467,138 | B1 * | 10/2002 | Aime | 29/25.35 |

FOREIGN PATENT DOCUMENTS

| | | |
|---|---|---|
| EP | 0 590 176 A1 | 12/1998 |
| EP | 0 590 176 B1 | 12/1998 |

* cited by examiner

ELECTRICALLY CONDUCTIVE MATCHING LAYERS AND METHODS

BACKGROUND

The present invention relates to matching layers. In particular, conductive acoustic matching layers that are used in sonic or ultrasonic transducer architectures or fabrication.

Acoustic matching layers provide acoustic impedance in between the typically high acoustic impedance of a transducer, typically incorporating a piezoelectric ceramic, and a subsequent medium with different acoustic impedance for the effective transmission of acoustic waves. In medical ultrasound applications, the patient represents relatively low acoustic impedance and the application of 1 or more matching layers provides better matching of the acoustic impedance for acoustic wave transmission between the transducer and the patient. Typically, matching layers are manufactured from non-conductive materials, such as polymers (e.g., epoxies or urethanes). The matching layer may include additional filler materials, such as metal or ceramic filler material, to increase the density and so generate the desired acoustic impedance to create or optimize the transmission of sound energy.

To make a non-conductive acoustic matching layer conductive, conductive filler is dispersed within the matching layer. The filler may be shaped and sized, such as providing needle like, or whisker type shapes. The filler is positioned randomly within the matching layer. High concentrations of electrically conductive fillers are provided for particle-to-particle contact throughout the bulk of the matching layer. The particle contact allows electrical conduction though the material. However, the high concentrations of filler result in higher acoustic impedance, rendering the matching layer less useful for matching the impedance of the transducer ceramic to the relatively low impedance of a patient, especially in multi-matching layer designs where the outermost matching layer is typically a relatively low impedance, such as less than 3 Mkayl.

As an alternative to a conductive filler, a conductive material, such as a solid graphite, magnesium, or conductive polymer chain may be used for the matching layer. However, solid materials such as graphite tend to have relatively higher or very specific acoustic impedances, limiting the usefulness of such matching layers. Graphite or other solid materials are machined, making the material less convenient than a castable polymer material for manufacturing curved parts. Conductive polymer molecules are typically modified (i.e., loaded) and rarely inherently conductive. The physical properties are limited for suitability in transducer applications and adequate conductivity.

For one-dimensional transducers and transducer arrays, conductivity between the upper and lower transmission surfaces of matching layers may be accomplished by a metallic plating or sputtered film on the edges of the matching layers electrically connecting the upper and lower surfaces. For one-dimensional transducer arrays, the sides of the matching layers are easily accessed for sputtering or plating. However, for multi-dimensional arrays, such as 1.5 or 2dimensional arrays, circumferential plating or sputtering is difficult to use due to the limited access to the sides of the matching layers of each element.

Phased 1.25, 1.5, 1.75 and 2 dimensional ultrasound arrays include a plurality of array elements in the elevation and azimuth dimensions. For a large steering angle, such as used with two-dimensional phased arrays, the elements desirably have acceptance angle and little or low electric and mechanical crosstalk both in elevation and the azimuth dimensions. Dicing is used to mechanically separate individual transducer elements to minimize the mechanical coupling or crosstalk. For example, one dimensional arrays typically have one or more acoustic matching layers positioned between the PZT ceramic and the lens or patient. The PZT and matching layers are diced in 1 axis separating individual array elements to reduce mechanical crosstalk through the matching layers. Electrical connections are provided to PZT along the edges of each array element.

For phased two-dimensional arrays, dicing is required in both the azimuth and elevation dimensions to reduce crosstalk. Either one or no electrically conductive, high impedance matching layers are stacked on top of the PZT ceramic and separated into individual elements. A common ground foil or signal-flex is laminated above the PZT and any electrically conductive matching layer, typically perpendicular to desired sound wave transmission to provide a second electrical connection to the PZT. The connecting conductive layer cannot be physically separated, as are the individual elements, in both dimensions if it is to provide external connection elements in the array. Electrically non-conductive matching layers are then laminated above the ground foil or signal-flex. The non-conductive matching layers provide a lower acoustic impedance. The non-conductive matching layers may additionally be diced in the azimuth and elevation dimensions. However, by using no matching layers or only one electrically conductive matching layer, reduced axial resolution and lower bandwidth result. Where additional non-conducting matching layers are provided but not diced, crosstalk increases and the acceptance angle is reduced. If the additional non-conductive matching layers are diced, an additional dicing process step results, and alignment issues may result. Crosstalk cannot be optimally reduced, since the acoustic matching layers cannot be entirely diced without risking cutting signal traces or the ground foil.

BRIEF SUMMARY

The present invention is defined by the following claims, and nothing in this section should be taken as a limitation on those claims. By way of introduction, the preferred embodiments described below include: electrically conductive acoustic matching layers, methods for conducting electrical current through matching layers, methods for manufacturing multi-dimensional arrays using conductive matching layers, and multi-dimensional arrays with electrically conducting matching layers. Matching layers with conductors aligned for providing electrical current through the thickness or range dimension of the matching layer are provided. For example, vias, aligned magnetic particles, or conductive films at least partially or entirely within the matching layer of each element allow electrical conduction from the transducer material to a ground foil or flex circuit. By using multiple electrically conductive matching layers, a gradation in acoustic impedance for better matching is provided while allowing dicing of the entire stack, including the matching layers and the transducer material, in one step.

In a first aspect, an improvement in an electrically conductive acoustic matching layer is provided having top and bottom surfaces substantially in elevation and azimuth planes. The improvement includes a conductor aligned to electrically connect the top and bottom surfaces at least partly within the matching layer.

In a second aspect, a method for conducting electrical current through a matching layer is provided. A conductive material is aligned relative to top and bottom surfaces of the matching layer. The conductive material is at least in part within the matching layer. The conductive material is electrically connected to the transducer.

Further aspects and advantages of the invention are discussed below in conjunction with the preferred embodiments.

BRIEF DESCRIPTION OF THE DRAWINGS

The components and figures are not necessarily to scale, with emphasis instead being placed upon illustrating the principles of the invention. Moreover, in the figures, like referenced numerals designate corresponding parts throughout the different views.

DETAILED DESCRIPTION OF THE DRAWINGS AND PRESENTLY PREFERRED EMBODIMENTS

Figure 1:
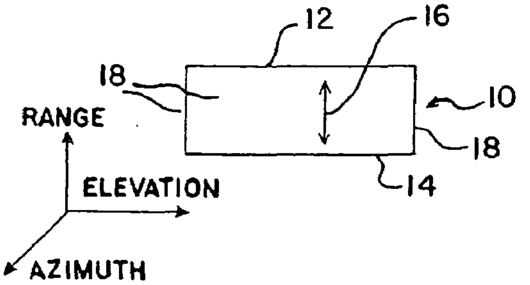
FIG. 1 is a graphical representation of one embodiment of an electrically conductive acoustic matching layer.

FIG. 1 shows an electrically conductive acoustic matching layer 10. The electrically conductive acoustic matching layer is formed of any of various materials, such as castable materials or solids. Example castable materials include polymers such as urethanes, epoxies, resins or other now known or later developed materials that cure into a solid, semi-solid or flexible material. Castable materials may further include one or more catalysts in a pre-mixed formula or added catalysts that cause the castable material to cure in response to room temperature, heat, light or other energy sources. Solid materials include graphite, ceramics, or other now known or later developed solid acoustic matching layer materials suitable for use in ultrasound transducers. The electrically conductive acoustic matching layer 10 is used in a sonic medical diagnostic transducer array, such as an array for ultrasonic imaging, but may alternatively be used in other sonic arrays, such as for materials testing.

The matching layer optionally includes one or more filler materials of any density. For example, metallic, ceramic or other now known or later developed materials, or combinations thereof are included within the matching layer. Fillers modify the density, increasing or decreasing the acoustic impedance. Different ratios of filler to castable material may be provided for different acoustic impedances. In one embodiment, the filler is evenly distributed throughout the matching layer, but uneven distributions may be used. In alternative embodiments, the matching layer 10 is free of additional filler materials.

The acoustic matching layer 10 has top and bottom surfaces 12, 14, each substantially in an azimuth and elevation plane (i.e., the surfaces extend along both the azimuth and elevation dimensions separated by a thickness along the range dimension). In many embodiments, the top and bottom surfaces are flat, such as planar surfaces that are perpendicular to the direction of acoustic propagation. Substantially is used herein to account for curved transducer surfaces, curved or stepped element surfaces, curved matching layers, variations in thickness or surface due to manufacturing techniques and tolerances or any other angular offset causing one of or the both of top and bottom surfaces to extend out of the azimuth and elevation planes. The top and bottom surfaces 12, 14 are separated by a thickness in the depth or range dimension. While shown in FIG. 1 as having a uniform thickness, a varying thickness may be provided for the matching layer 10. The dimensions of azimuth, elevation and range are provided relative to a transducer, such that a transducer would transmit acoustic energy generally along the range dimension from each element of an array of elements spaced along the Azimuth dimension and/or the elevation dimension.

As shown in FIG. 1, the matching layer 10 corresponds to a single element of a transducer. The matching layer 10 extending over multiple elements may be provided. In one embodiment, the same matching layer 10 is provided for each or all of the elements of an ultrasound transducer, but the matching layer 10 is diced or otherwise formed to prevent or reduce acoustic crosstalk between the elements. In one embodiment, only a single matching layer 10 is provided on one or more of the elements. In alternative embodiments, a plurality of acoustic matching layers 10 are provided on one or more of the elements of the transducer.

For electrically conductive acoustic matching layers, a metal layer is provided on each of the top and bottom surfaces 12, 14 of the matching layer. The metal layer extends over the entire surface or only just a portion of the surface. In one embodiment, the metal layer is deposited, plated or sputtered onto the matching layer 10. In alternative embodiments, the metal layer is placed adjacent to the matching layer 10 or otherwise bonded to the matching layer 10, such as associated with providing a separate ground foil, signal trace or flexible circuit bonded to the matching layer without having to sputter, deposit, plate or otherwise form a metal layer on the matching layer 10. In alternative embodiments, no metal layer is provided on the top and/or bottom surfaces.

To conduct electric current between the metal layers or through the matching layer 10, a conductor 16 is aligned relative to the top and bottom surfaces at least partially within the matching layer 10. The conductor 16 comprises any material of any of various shapes or sizes capable of conducting the electric current from the top surface 12 to the bottom surface 14 or vice versa. Some examples of such conductors are discussed below. Other conductors aligned within the matching layer 10 may be used.

As shown in FIG. 1, the alignment is such that the conductor extends substantially perpendicular to the top and bottom surfaces 12, 14. Conductors 16 extending at angles other than 90 degrees from the top and bottom surfaces 12 and 14 may be provided. The conductor 16 may follow a less direct path, such as along a curved or twisting conductor through the matching layer 10 in other embodiments. The conductor 16 is aligned such that some form of organization has occurred resulting in the conductor electrically communicating between the top and bottom surfaces rather than random metallic fillings being used.

As shown in FIG. 1, the conductor 16 is within the matching layer 10 such that the conductor 16 is not exposed on a side 18 of the matching layer 10, and is exposed only on the top and bottom surfaces 12, 14. In alternative embodiments, the conductor 16 is at least partially within and partially on the edge of the matching layer 10. For example, a conductive film is exposed on an outer side 18 of the matching layer 10 but also extends within the matching layer as a planar sheet extending from the top surface 12 to the bottom surface 14, with an edge of the conductive film or sheet at the side 18 and/or another side in the range dimension of the matching layer 10.

Figure 2A:
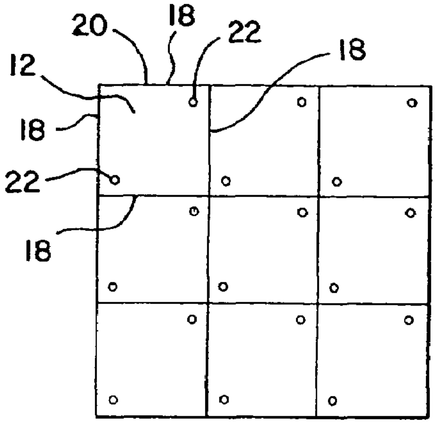
FIGS. 2A and 2B are top and cross sectional views of one embodiment of an array of elements with vias for electrical conductivity.

In one embodiment, the conductor 16 is positioned closer to an edge 18 of the matching layer than to the center of an element along the elevation and azimuth plane of the bottom or top surface 12, 14. For example, FIG. 2A shows an element 20 with two conductors 22 positioned near edges 18, and further away from the center of the element 20. Positioning the conductor 16 near the edges 18 of the matching layer 10 subjects the conductor 16 to less mechanical expansion and contraction due to operation of the transducer. The reduction in strain may provide longer life of the transducer and less delamination of the conductor 16.

As also shown in FIG. 2A, more than one conductor 16 is provided in some embodiments. Any number of conductors 16, such as 1, 2, 3 or more conductors 16 may be used for each element 20. Different numbers of conductors 16 may be used for different elements. Two or more conductors 16 are provided to prevent failure of an element due to failure of a single conductor. The conductors 16 are provided in any of various patterns or randomized positions on the top and bottom surfaces of each element and associated matching layer 10.

Figure 2B:
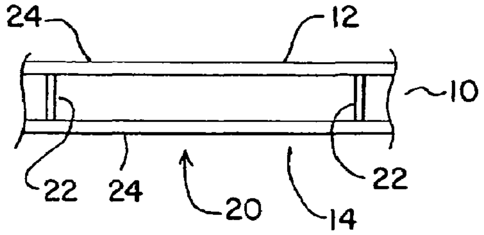

FIGS. 2A and 2B show one example embodiment of the conductor 16. The conductor 16 is a via 22 with conductive material extending from the top surface 12 to the bottom surface 14. The matching layer 10 is formed of desired material with resulting desired acoustic impedance, such as an acoustic impedance of 2.5 to 7 MRyals, but greater or lesser acoustic impedances may be provided, such as closer to the 1.5 MRayl of water or the 35 MRayl that is typical of piezoelectric ceramic. Where the matching layer 10 is formed from a castable material, the matching layer 10 is cured.

The vias 22 are formed in any of various patterns, such as the two vias 22 at the corners of the element 20 shown in FIG. 2A. The vias 22 are formed by a laser, plasma etch, other etching technique, drilling, or other now known or later developed technique for forming vias. The vias 22 may be distributed in any pattern, include any number of vias 22 and/or have any shape, such as circular elliptical, or slots. If the pattern falls within a kerf (partially in the element), then additional size of the via 22 may make fabrication of via 22 and subsequent metallization easier. Using any number and size accommodates filling with a conductive and/or non conductive material to create a different acoustic impedance and conductivity between the top and bottom surfaces. The via 22 is formed to extend from the top surface 12 to the bottom surface 14. In one embodiment, the via is 1 to 2 mils, such as 1.5 mils in diameter and 3 to 6 mils thick or deep. Other thicknesses for the matching layer 10 may be used as well as other diameters of the vias 22. The conductive material, such as metal, is then wet plated, electroless plated, vapor deposited sputtered, deposited, plated, or formed using any other thin film technique to any of various thicknesses, such as several microns within the via 22. The thickness of the conductive material within the via 22 is as little as possible while allowing for continuous electrical conductivity without affecting the bulk acoustic impedance and acoustic performance of the matching layer 10. Alternatively, the entire via 22 is filled with conductive material.

In one embodiment, metal layers 24 are deposited on the matching layer 10 prior to forming the vias 22. In alternative embodiments, the vias 22 are formed, and then the conductive material is provided within the via 22 as part of the same process or a different process for forming the metal layers 24.

FIG. 2A shows an array of nine elements 20 with a pattern of two vias 22 for each element 20. Arrays with different numbers of elements extending along either of the elevation and/or azimuth dimensions may be provided in alternative embodiments. In one embodiment, the matching layer 10 for the entire or a portion of the transducer array is formed prior to dicing the elements. The vias 22 are patterned across the sheet as is appropriate for later formation of the elements. At least one via 22 is provided for each element or sub-element where any elements are sub-diced due to spacing, thickness or other frequency-based concerns. In one embodiment, the vias 22 are positioned such that at least one via 22 remains uncut or undiced. For example, at least one via 22 is positioned away from an edge 18 of the element 20. In other embodiments, the via 22 is positioned such that the dicing cut defining an edge or separation between two adjacent elements cuts through the via 22. In another embodiment, all of the vias 22 are positioned such that the element dicing cuts do not cut through any of the vias 22. As shown, each of the vias 22 is associated with an opposite corner of the element 20, but other positions for one or both of the vias 22 is provided in alternative embodiments, such as along edges 18 away from the corners or spaced closer to the center of the element 20. The sheet of matching layer material is stacked on the transducer material and then each element is diced, including cuts through the matching layer. In alternative embodiments, the sheet of matching layer material is uncut or diced at a different time than the transducer material. The vias 22 could vary by number and size such that filling them with a different material results in a material with a composite acoustic impedance controlled by the individual material properties and the volume fraction. In the case where the filler, the substrate, or both are conductive, a range throughout the conductive matching layer is provided with a desired impedance.

Figure 3A:
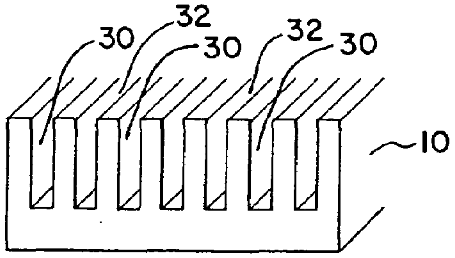
FIGS. 3A-C graphically represent various phases of manufacture of a matching layer with a conductive film in one embodiment.
Figure 3B:
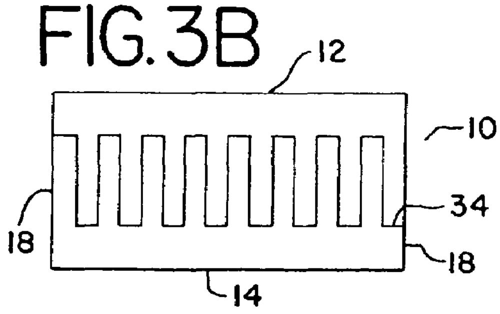
Figure 3C:
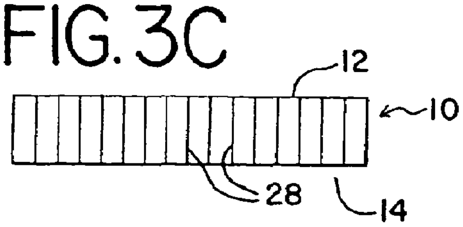

FIG. 3C shows another example embodiment of the matching layer 10 with conductors aligned between the top and bottom surfaces 14. As shown in FIG. 3C, a plurality of conductive films 28 extend from the top surface 12 to the bottom surface 14 at least partially within the matching layer 10. Each of the conductive films 28 is a planar sheet, but linear traces, curved sheets, curved traces or other structures may be used.

Figure 4:
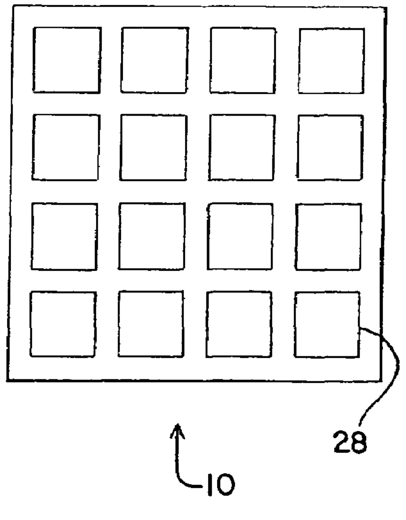
FIG. 4 is a top view of a matching layer with a plurality of conductive films in one embodiment.

In one embodiment, each of the conductive films 28 is sputtered metal, but other conductors and/or deposition techniques may be used. FIG. 4 shows a top view of a matching layer 10 where each of the conductors 28 is exposed on the top surface 12 of the matching layer. Each of the conductive films 28 has an enclosed shape, such as a square or rectangle, in cross section viewed perpendicular to the azimuth and elevation plane. Trapezoidal, circular or parallelogram, or other shapes may be provided. In alternative embodiments, one or more of the conductive films 28 is a planar sheet or trace resulting in a single exposed line or point rather than an enclosed shape.

FIGS. 3A and 3B show intermediate steps in forming the conductive film 28 on the interior or at least partially within the matching layer 10. As shown in FIG. 3A, a plurality of interior surfaces 30 are formed within the matching layer 10. For a matching layer 10 of castable or solid material, the matching layer 10 is formed and ground to a uniform thickness or other desired thickness. The matching layer 10 is then diced to form kerfs 32 extending into but not through the matching layer 10. The side walls of the kerfs provide the interior surfaces 30. In one embodiment, the kerfs are wide enough such that the depth of the dicing is one to two times the width of the kerf. Other dimensional relationships and/or numbers of kerfs may be provided, resulting in a greater or fewer number of interior surfaces 30 for any given element or matching layer extent. In one embodiment, a single kerf is provided for each element or even a single side wall of a kerf is provided for each element.

In an alternative embodiment for castable matching layers 10, the interior surfaces 30 are formed using a mold. For example, a stainless steel structure with grooves is coated with a mold-release coating. The castable matching layer material is then placed in the mold. Once cured, the matching layer 10 is removed. As a result of grooves or fins provided within the mold, the interior surfaces 30 are formed.

Where molding processes are used, tapered, non-linear, shaped vertical walls with fixed or variable separation may be provided as a function of the design of the mold. Dicing cuts of multiple dimensions or widths may be used for forming various shapes at various angles using the kerf embodiment. By tapering as a function of the mold or multiple dicing cuts of different widths, an acoustic property of the matching layer 10 may be varied as a function of depth.

To provide the enclosed conductive films shown in FIG. 4, the kerfs or interior surfaces 30 are formed in a criss-cross pattern, such as associated with dicing parallel to the azimuth dimension and then parallel to the elevation dimension. Angles other than 90 degrees may be used between the different cuts.

The conductive material is positioned on the interior surfaces 30. For example, one of sputtering, deposition, plating or other now known or later developed techniques for providing a metal film on an interior surface 30 is used. In one embodiment, titanium is deposited on the interior surfaces as well as other exposed edges. A layer of gold is then formed above the titanium using sputter deposition. Other metal layers may be provided, such as chrome and gold or non-gold metal layers. By providing a thin metal film, such as a film less than 10 microns, acoustic impedance of the matching layer 10 is maintained as desired. In one embodiment, the metal is deposited to 0.1 to 0.2 microns in thickness using plating or other techniques.

As shown in FIG. 3B, the kerfs 32 are filled such that the parts of the matching layer 10 associated with the interior surfaces 30 are filled or covered. For a castable matching layer, a same or different matching layer material is cast and cured within the kerfs 30. Where tapered kerfs are provided, a different matching layer material may be cast, resulting in a change in acoustic impedance as a function of depth. For a solid matching layer material, the kerfs 32 are filled with a castable matching layer material, or another piece of solid matching layer material is cut or diced with the same pitch or shape in the same pattern. The two solid pieces are then epoxied together or otherwise bonded to form the interleaved structure shown in FIG. 3B.

As a result of the bonding or further casting, a matching layer 10 includes an interconnected pattern or zig-zagged (in cross-section) conductive film within the matching layer 10. The conductive film 34 is positioned between separate volumes of the solid or castable matching layer. As shown in FIG. 3B, the conductive film 34 is exposed on edges 18 of the matching layer and is unexposed on the top and bottom surfaces 12 and 14. In alternative embodiments, the kerfs 32 are only partially filled, resulting in exposure of the conductive film 34 on either of the top or bottom surfaces 12, 14.

The top and bottom surfaces 12 and 14 are ground or otherwise machined to provide flat or other surfaces with the conductive film 34 exposed on both the top and bottom surfaces 12, 14. FIG. 3C shows the matching layer 10 of FIG. 3B after grinding. The portions of the conductive film 34 parallel with the top and bottom surfaces 12, 14 in the azimuth and elevation planes are ground away. The matching layer 10 may be ground to expose the electrical conductor 34 without removing the horizontal surfaces in other embodiments. The conductors 28 electrically connect the top surface 12 to the bottom surface 14. Once the matching layer 10 is ground to the desired thickness, metal layers are optionally provided on the top and bottom surfaces 12, 14 for further electrical connection. In alternative embodiments, the matching layer 10 is used without additional metal layers being deposited on the top and bottom surfaces 12, 14.

Figure 8A:
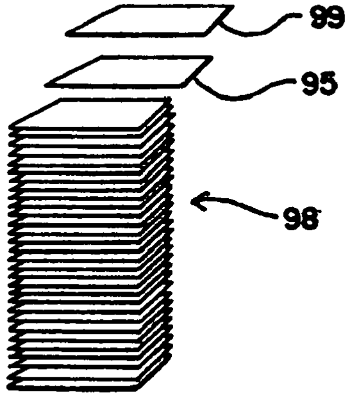
FIGS. 8A-C show one embodiment for forming a conductive matching layer.
Figure 8B:
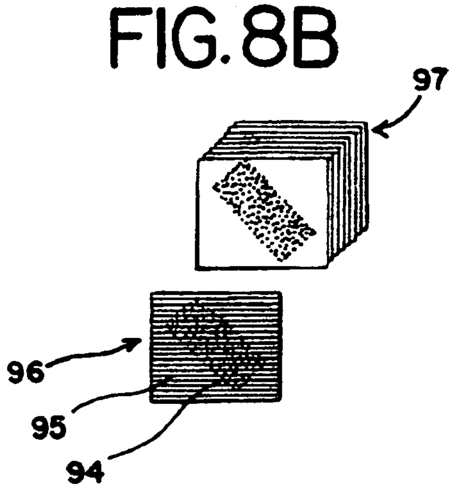
Figure 8C:
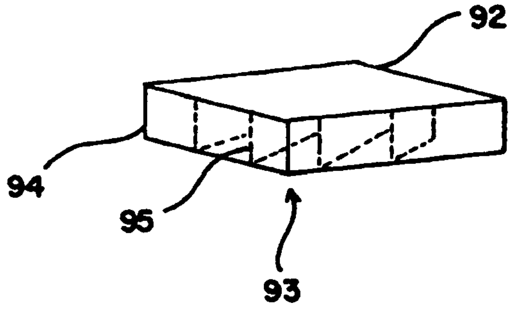

FIG. 8C shows a similar embodiment of the matching layer 10, labeled as 94, with conductors aligned between the top and bottom surfaces 93. As shown in FIGS. 8A-C, a plurality of conductive films 95 extend from the top surface 92 to the bottom surface 93 at least partially within the matching layer 94. Each of the conductive films 95 is a planar sheet, but linear traces, curved sheets, curved traces or other structures may be used.

FIGS. 8A and 8B show intermediate steps in forming the matching layer conductive film 95 on the interior or at least partially within the matching layer 94. As shown in FIG. 8A, a plurality of interior surfaces are formed by stacking and bonding together layers of conductive 95 and non-conductive 99 material with the thickness of the insulating non-conductive layers 99 to achieve the desired location or periodicity of conductivity between the final matching layer top surface 92 and bottom surface 93. The matching layers 94 is cut out from sections 96 of the bonded stacked layer block of material perpendicular to the conductive planes or at any angle such that conductive planes 95 extend to the resulting top surface 92 and bottom surface 93.

Utilizing thin conductive layers 95 or conductive materials with similar acoustic properties to the insulating layers, changes in the acoustic impedance of the majority bulk insulating material are minimized, allowing for conductive low acoustic impedance material. A different, composite acoustic impedance is achieved, if desired, by selecting material properties, material thicknesses variations and/or patterns to be combined, bonded or fused with the necessary volume fractions.

Any now known or later developed techniques are employed to bond the layers together. For example, adhesives, like epoxy, or fusing the material together using heat and/or pressure to melt or cure materials are used. The insulating layers may be cast, or the adhesive itself is used as the insulating layer. Alternatively, the adhesive is conductive and is used to form the conductive layer applied to the insulating material or as an adhesive between conducting and/or non conducting layers. Pressure during adhesive bonding may minimize bond lines and control bond thickness so that the desired conductor periodicity in the layered dimension is obtained. Fillers may also be used to control bond lines and/or layer thicknesses. Anodic bonding or processes similar to soldering may be used to solder together metal layers of the insulating material.

The conductive surfaces 95 may be patterned or connected to other surfaces with vias through the insulating material to provide complex conductive paths within the bulk of the resulting matching layer material. These paths may or may not extend to the top and bottom surfaces 92, 93 of the resulting matching layer component. A conductive path or connection between layers is accomplished by adhesively bonding layers with thin bond lines to achieve asperity contact soldering.

In one embodiment, 300 micron thick sheets 99 of an insulating low acoustic impedance polymer film like Kapton is metalized by sputtering 10 microns of copper and flashed with titanium as an adhesive layer that is also a conductive layer 95 onto one or both upper and lower surfaces (i.e., the flat surfaces perpendicular to the thickness of the film) which may or may not be subsequently patterned. The layers are adhesively bonded together with an unfilled epoxy under heat and pressure. The block 97 is sliced perpendicular to the planes of the bonded metalized layers. The top and bottom surfaces 92 and 93 are ground or otherwise machined to provide flat or other surfaces with the conductive film 95 exposed on both the top and bottom surfaces 92, 93. Once the matching layer 94 is ground to the desired thickness, metal layers are optionally provided on the top and bottom surfaces 92, 93 for further electrical connection. In alternative embodiments, the matching layer 94 is used without additional metal layers being deposited on the top and bottom surfaces 92, 93.

Figure 9A:
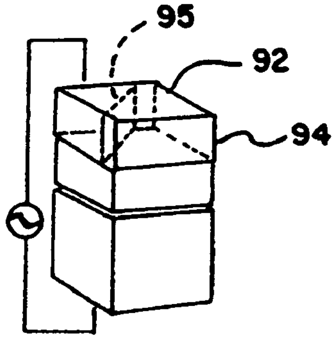
FIG. 9A is a perspective view of one embodiment of an element using a conducive matching layer.
Figure 9B:
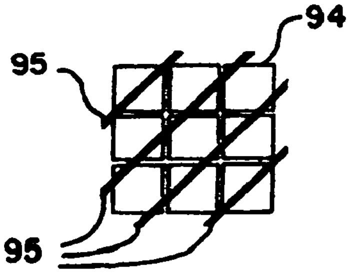
FIG. 9B is a top view of one embodiment of a matching layer diced for use on a two-dimensional array.

FIGS. 9A and 9B show a transducer element with a planar conductor within one matching layer. For example, the matching layer 94 of FIG. 8C is used with a 3 by 3 array of elements as shown in FIG. 9B. FIG. 9B shows a top view of the nine elements with bold lines representing the planar conductors within the matching layer. As shown in FIG. 9A, an element includes the PZT with two conductive matching layers. The layer adjacent the PZT is a high acoustic impedance material with a bulk intrinsic conductivity. The upper layer or layer spaced away from the PZT is the conductive layer with the planar conductor connecting the top and bottom surfaces. The bottom surface rests against the other matching layer.

Figure 5A:
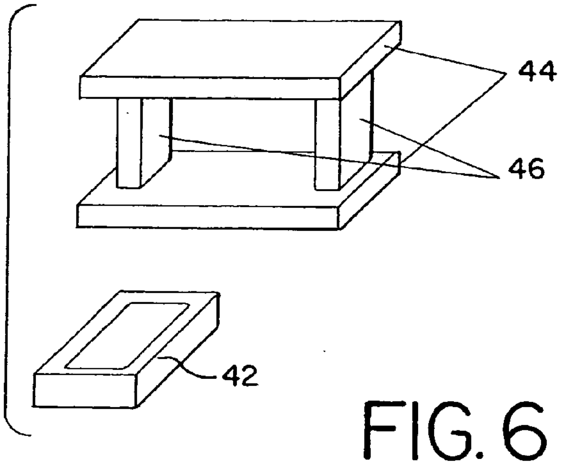
FIGS. 5A and B graphically represent one embodiment of a matching layer with aligned magnetic particles and a method for aligning the magnetic particles.
Figure 5B:
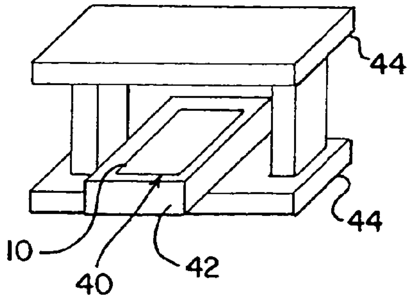

FIGS. 5A and 5B show another example embodiment of the conductor 16 in the matching layer 10. In this example embodiment, a castable matching layer material is filled with conductive, magnetic particles. By curing the material in a magnetic field, the magnetic particles are aligned and drawn into contact along the magnetic field lines. As a result of the magnetic field, the longest dimension of each of the magnetic particles is more likely aligned along a dimension more perpendicular than parallel to the top and bottom surfaces 12, 14 where the magnetic field lines extend more perpendicular than parallel.

In one embodiment, the magnetic particles are a soft magnetic material. Soft magnetic materials are magnetic only in the presence of a magnetic field. The particles have any of various shapes, such as spherical, platelets, rods, wires, fibers, whisker like or other now known or later developed shapes. In one embodiment, a nickel powder is provided, but iron, cobalt or alloys of iron cobalt, or nickel may be used. Nickel may be chosen because nickel is less likely to oxidize. To avoid oxidation of nickel or other materials, the particles may be coated, such as with gold. The particles are formed by milling or are otherwise randomly created, such as in an attrition process. In one embodiment, the particles are around 5 microns, but may be larger or smaller, such as 1 to 20 microns. The particles are not necessarily ground or formed to have a particular shape, such as whiskers or needles. In alternative embodiments, particular elongated shapes are formed. In one exemplary embodiment, a nickel powder loading of 1 to 12 percent by volume or 8 to 50 percent by weight in a castable epoxy is provided as the matching layer 10.

As shown in FIG. 5A, a tray 42 is filled with the matching layer materials, including the castable matching layer material, the magnetic particles, and any additional filler. In one embodiment, the matching layer material is a low-viscosity resin with a catalyst for curing.

Two magnets 44 are held apart by non-metallic supports 46. In one embodiment, the non-metallic supports 46 are ceramic, plastic or rubber, but other now known or later developed materials may be used. The magnets 44 are barium ferrite or other permanent magnets. Any permanent or electromagnet may be used. The magnets 44 are spaced from each other by the supports 46 by about two to three times the desired height of the matching layer 10. Greater or lesser separation may be provided, such as two to three inches. The magnets 44 are aligned such that the magnetic field lines extend between the two magnets in a vertical direction as shown in FIG. 5A. Any of various magnetic field strengths may be used. Weak magnetic field strengths sufficient to cause some magnetic particles to align along the magnetic field lines may be used.

As shown in FIG. 5B, the tray or platen 42 is positioned between the magnets 44 for curing. In one embodiment, a chemical catalyst is used for curing, but heat may be applied for accelerated curing. Where heat is applied, the heat level is monitored or magnets are selected such that the heat does not destroy the effectiveness of the magnets over at least the curing cycle and preferably over a number of curing cycles. In one embodiment, the frame formed by the magnets 44 and the supports 46 is placed in an oven typically used for curing castable matching layer materials. Once solidified, the matching layer material holds the magnetic particles as aligned by the field lines within the matching layer even when removed from the magnetic field. Due to the alignment along the magnetic field lines, more conductivity if provided between the top and bottom surfaces 12 and 14 than between edge surfaces. This anisotropic conductor provides conductive material aligned more from the top surface to the bottom surface than from the edge 18 to edge 18.

The matching layer block is then ground, sanded or sawed to provide the desired matching layer dimensions. Even with the magnetic particles, electrically conductive matching layers with 2.5 to 3.5 MRyal or other acoustic impedances are provided to handle and act acoustically as conventional, non-conductive matching layers. In contrast, graphite matching layers may have an acoustic impedance of around 7 MRayl.

Using any of the electrically conductive acoustic matching layers discussed above, a method is provided for conducting electrical current through the matching layer. Conductive material is aligned relative to top and bottom surfaces 12, 14 of the matching layer 10 (i.e., the conductive material is perpendicular to the azimuth and elevation planes of an ultrasound transducer). The conductive material 16 is provided at least in part or entirely within the matching layer 10 even after forming the elements 20 of the array. By aligning the conductor perpendicular to the top and bottom surfaces 12, 14, electrical current is conducted from either of the top or bottom surface 12, 14 to the other of the bottom and top surfaces 14, 12. One or a plurality of paths of conductive material 16 is provided through the matching layer for each element of an ultrasound transducer.

For more efficient electrical communication of the current from the matching layer to another matching layer, ground plane, flex circuit, signal trace, transducer, PZT material or element, one or more of the top and bottom surfaces 12, 14 of the matching layer 10 include a metal layer. For example, the electrode of a PZT ceramic is placed in contact and bonded to the matching layer 10. As a result, the conductive material is electrically connected with the transducer. The conductive material is also electrically connected with a system, such as through a ground foil or signal trace.

Figure 6:
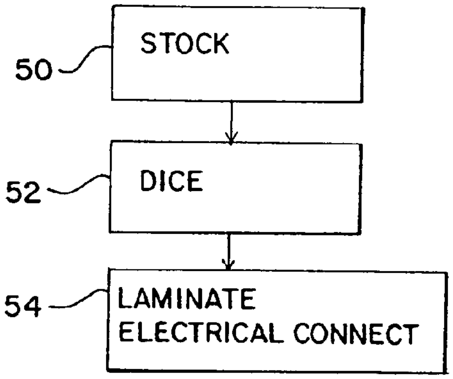
FIG. 6 is a flowchart of one embodiment for forming a multi-dimensional array with a plurality of electrically conductive acoustic matching layers.

FIG. 6 shows a method for manufacturing a multi-dimensional array of N×M elements where both N and M are greater than one. For example, a 1.25D, 1.5D, 1.75D, 2D or other multi-dimensional arrangement of elements is provided with electrically conductive acoustic matching layers. Multiple acoustic matching layers are provided for acoustic impedance matching, allowing efficient acoustic matching between the transducer and the patient. To avoid separately dicing the elements of the transducer and the matching layers, a plurality of the matching layers are electrically conductive.

In act 50, at least two matching layers operable to conduct electric current are positioned or stacked on at least one element of the array. For example, any of the electrically conductive acoustic matching layers discussed herein, including in the background section, are used. For example, sheets of matching layers are stacked or positioned on top of transducer material for later dicing into individual elements of the multi-dimensional array.

In one embodiment, two electrically conductive acoustic matching layers are stacked with or without additional non-conductive matching layers. In other embodiments, three electrically conductive acoustic matching layers are used. All or only a subset of the matching layers for a given element are electrically conductive. In one embodiment, different types of electrically conductive acoustic matching layers are used as a function of the desired acoustic impedance. For example, a solid graphite matching layer is used adjacent to the transducer material, but castable material, electrically conductive matching layers with lower acoustic impedance are used closer to the patient or lens. Any combination of magnetic particles, vias or conductive film-type matching layers may be used. In one embodiment, two or more of the matching layers are of the same type of construction but with different amounts of filler material or different thicknesses. In other embodiments, different types of matching layers are used in combination.

In act 52, the stacked transducer material and electrically conductive acoustic matching layers are diced. The dicing is performed in both the azimuth and elevation dimensions. The dicing forms kerfs defining individual elements of the multi-dimensional transducer array. The same dice is used to cut both the matching layers as well as the electroceramic material. In alternative embodiments, separate dicing cuts are used to acoustically isolate the matching layers than are used to electrically isolate the transducer material. All of the electrically conductive matching layers are diced at the same time, but may be separately diced in other embodiments.

In act 54, the electrically conductive matching layers are electrically connected to other components of the transducer. For example, an electrically conductive matching layer closest to the lens or on top of the stack is laminated to a ground foil, flex circuit or signal trace. As another example, an electrically conductive matching layer 10 closest to the transducer material is laminated to the transducer material or to an electrode on the transducer material. The electrically conductive matching layers are laminated or bonded to each other, providing electrical communication between the ground foil, signal trace or flex circuit and the transducer material. Since electrically conductive acoustic matching layers having low acoustic impedance as described above are available, a multi-dimensional transducer array with matching layers diced or kerfed to avoid crosstalk is provided using a single dicing step.

Figure 7:
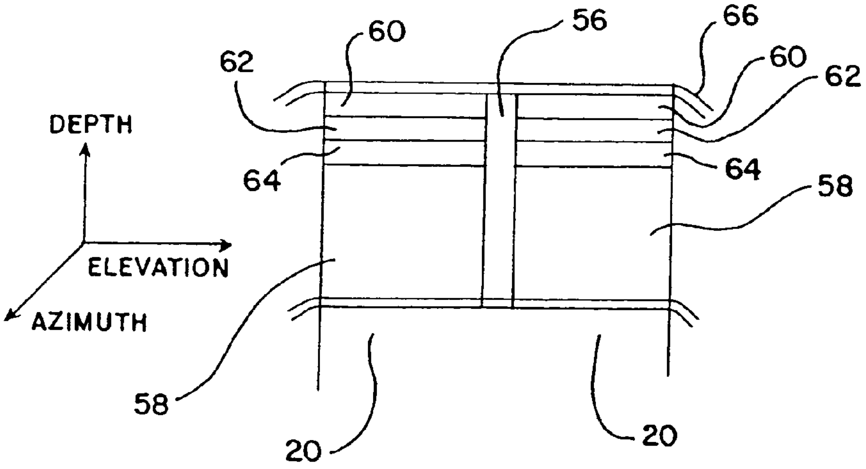
FIG. 7 is a graphical representation of a multi-dimensional array with a plurality of electrically conductive acoustic matching layers.

FIG. 7 shows a portion of a multi-dimensional array of transducer elements. In particular, two elements 20 are shown spaced from each other by a kerf 56 along the elevation dimension. Each of the two elements includes transducer material 58. The kerf 56 defines the elements 20. The kerf 56 extends through matching layers 60, 62 and 64. Additional elements may be provided along the elevation dimension. A plurality of elements is also provided along the azimuth dimension, and the elements are defined by kerfs extending through the matching layers and transducer material.

While three matching layers are shown, another number of matching layers 60, 62, 64 may be used. In one embodiment, all of the matching layers 60, 62, 64 are electrically conductive, but only a subset is conductive in other embodiments. Vias, magnetic particles or conductive films provide conductive material 16 aligned along the thickness dimension for providing an electrical signal from the transducer material 58 to a ground foil, signal trace or flex circuit 66.

Various aspects and combinations of aspects of the invention are described above. Any single one or possible combinations of the aspects may be used. For example, any of the electrically conductive acoustic matching layers may be used alone on single element, one-dimensional or multi-dimensional arrays. As another example, using multiple electrically conductive acoustic matching layers on a one-dimensional or single element array is possible. As yet another example, multiple matching layers whether electrically conductive or not are stacked on a multi-dimensional array and diced at the same time as the transducer material.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A sonic transducer comprising:

elements of transducer material, the elements separated by kerfs;

a first layer of material on a first side of the transducer material, the first layer free of through kerfs and supporting the elements; and an electrically conductive acoustic matching layer having top and bottom surfaces, each of the top and bottom surfaces substantially in an azimuth and elevation plane, the matching layer on a second side of the transducer material, the second side opposite the first side and closer to a lens or patient than the first side, the matching layer further comprising:

a conductor aligned relative to the top and bottom surfaces at least partly within the matching layer; and a metal layer on each of the top and bottom surfaces;

wherein the matching layer has an acoustic impedance between acoustic impedances of the transducer material and a patient.

2. The transducer of claim 1 wherein the conductor is aligned perpendicular to the top and bottom surfaces.

3. The transducer of claim 1 wherein the matching layer corresponds to an element of the transducer, the conductor positioned closer to an edge of the element than a center of the element along the elevation and azimuth plane of the bottom surface.

4. The transducer of claim 1 wherein the matching layer and an additional conductive matching layer are on a same side of the transducer.

5. A sonic transducer comprising:

elements of transducer material, the elements separated by kerfs;

a first layer of material on a first side of the transducer material, the first layer free of through kerfs and supporting the elements; and an electrically conductive acoustic matching layer having top and bottom surfaces, each of the top and bottom surfaces substantially in an azimuth and elevation, the matching layer on a second side of the transducer material, the second side opposite the first side and closer to a lens or patient than the first side, the matching layer further comprising:

a conductor aligned relative to the top and bottom surfaces at least partly within the matching layer;

wherein the matching layer corresponds to an element or sub-element of the transducer, the conductor and at least one additional conductor aligned between the top and bottom surfaces within the element or sub-element, the element or sub-element separated from other elements or sub-elements by kerfs;

wherein the matching layer has an acoustic impedance between acoustic impedances of the transducer material and a patient.

6. A sonic transducer comprising:

elements of transducer material, the elements separated by kerfs;

a first layer of material on a first side of the transducer material, the first layer free of through kerfs and supporting the elements; and an electrically conductive acoustic matching layer having top and bottom surfaces, each of the top and bottom surfaces substantially in an azimuth and elevation plane, the matching layer on a second side of the transducer material, the second side opposite the first side and closer to a lens or patient than the first side, the matching layer further comprising:

a conductor aligned relative to the top and bottom surfaces at least partly within the matching layer;

wherein the matching layer comprises castable material;

wherein the matching layer has an acoustic impedance between acoustic impedances of the transducer material and a patient.

7. The transducer of claim 6 wherein the castable material comprises a polymer.

8. A sonic transducer comprising:

elements of transducer material the elements separated by kerfs;

a first layer of material on a first side of the transducer material, the first layer free of through kerfs and supporting the elements; and an electrically conductive acoustic matching layer having top and bottom surfaces, each of the top and bottom surfaces substantially in an azimuth and elevation plane, the matching layer on a second side of the transducer material, the second side opposite the first side and closer to a lens or patient than the first side, the matching layer further comprising:

a conductor aligned relative to the top and bottom surfaces at least partly within the matching layer;

wherein the conductor comprises a conductor material in a via extending from the top surface to the bottom surface, the via having less lateral extent in the azimuth and elevation plane than the top and bottom surfaces;

wherein the matching layer has an acoustic impedance between acoustic impedances of the transducer material and a patient.

9. The transducer of claim 8 wherein the conductor material is a metal plating.

10. A sonic transducer comprising:

elements of transducer material, the elements separated by kerfs;

a first layer of material on a first side of the transducer material, the first layer free of through kerfs and supporting the elements; and an electrically conductive acoustic matching layer having top and bottom surfaces, each of the top and bottom surfaces substantially in an azimuth and elevation plane, the matching layer on a second side of the transducer material, the second side opposite the first side and closer to a lens or patient than the first side, the matching layer further comprising:

a conductor aligned relative to the top and bottom surfaces at least partly within the matching layer;

wherein the conductor comprises conductive film extending from the top surface to the bottom surface at least partly within the layer, the film less than 10microns thick;

wherein the matching layer has an acoustic impedance between acoustic impedances of the transducer material and a patient.

11. The transducer of claim 10 wherein the conductive film comprises sputtered conductive material.

12. The transducer of claim 10 wherein the conductor comprises a plurality of enclosed shapes in cross section viewed perpendicular to the azimuth and elevation plane of the top surface.

13. The transducer of claim 10 wherein the matching layer comprises a solid matching layer material, the conductor positioned between separate volumes of the solid matching layer material.

14. A sonic transducer comprising:

elements of transducer material, the elements separated by kerfs;

a first layer of material on a first side of the transducer material, the first layer free of through kerfs and supporting the elements; and an electrically conductive acoustic matching layer having top and bottom surfaces, each of the top and bottom surfaces substantially in an azimuth and elevation plane, the matching layer on a second side of the transducer material, the second side opposite the first side and closer to a lens or patient than the first side, the matching layer further comprising:

a conductor aligned relative to the top and bottom surfaces at least partly within the matching layer;

wherein the conductor comprises magnetic particles aligned such that the longest dimension of the magnetic particles is more along a dimension perpendicular than parallel to the top and bottom surfaces;

wherein the matching layer has an acoustic impedance between acoustic impedances of the transducer material and a patient.

15. The transducer of claim 14 wherein the magnetic particles comprise a soft magnetic powder.

* * * * *